United States Patent [19]

Celotta et al.

[11] Patent Number: 5,360,764
[45] Date of Patent: Nov. 1, 1994

[54] METHOD OF FABRICATING LASER CONTROLLED NANOLITHOGRAPHY

[75] Inventors: Robert J. Celotta, Darnestown; Jabez J. McClelland, Bethesda, both of Md.

[73] Assignee: The United States of America, as represented by the Secretary of Commerce, Washington, D.C.

[21] Appl. No.: 18,455

[22] Filed: Feb. 16, 1993

[51] Int. Cl.⁵ .................. H01L 21/268; H01L 21/306
[52] U.S. Cl. ..................................... 437/173; 437/80; 437/81; 437/948; 250/251
[58] Field of Search ........................ 427/259; 156/643; 437/80, 81, 948, 173; 148/DIG. 105, DIG. 106, DIG. 143; 250/251

[56] References Cited

U.S. PATENT DOCUMENTS

| | | | |
|---|---|---|---|
| 3,360,733 | 12/1967 | Vali et al. | |
| 3,710,279 | 1/1973 | Ashkin | 331/94.5 |
| 4,047,026 | 9/1977 | Bjorkholm et al. | 250/251 |
| 4,091,256 | 5/1978 | Früchtenicht | 250/251 |
| 4,327,288 | 4/1982 | Ashkin et al. | 250/251 |
| 4,612,072 | 9/1986 | Morrison et al. | 437/80 |
| 4,629,899 | 12/1986 | Plies | 250/251 |
| 4,639,301 | 1/1987 | Doherty et al. | 250/251 |
| 4,886,964 | 12/1989 | Pritchard et al. | 250/251 |
| 4,895,790 | 1/1990 | Swanson et al. | 156/654 |
| 4,896,032 | 1/1990 | Ball et al. | 250/251 |
| 4,980,896 | 12/1990 | Forsyth et al. | 372/101 |
| 5,019,705 | 3/1991 | Compton | 250/251 |
| 5,027,334 | 6/1991 | Yamanaka et al. | 369/13 |
| 5,126,574 | 6/1992 | Gallagher | 250/492.2 |
| 5,135,609 | 8/1992 | Pease et al. | 156/654 |
| 5,155,550 | 10/1992 | Barger | 250/225 |
| 5,212,382 | 5/1993 | Sasaki et al. | 250/251 |
| 5,280,174 | 1/1994 | Banks et al. | 250/251 |

OTHER PUBLICATIONS

Timp et al., "Using Light as a Lens for Submicron, Neutral-Atom, Lithography", Physical Review Letters, vol. 69, No. 11, Sep. 14, 1992, pp. 1636-1639.
Robert Pool in Science vol. 255, Mar. (1992), pp. 1513-1515 "optics' New Focus: Beams of atoms".
Prentiss et al. Appl Phys. Lett. 60 (8), Feb. (1992), pp. 1027-1029 "Using light as a stencil".
Carnal et al. Phys. Rev. Lett May (1991), pp. 2689-2692, "Young's double slit experiment with atoms: A simple atom interferometer".
Wolf et al. Lattice press 1986, vol. 1, p. 479, "Silicon processing for the VLSI era".
Keith et al. Phy. Rev. Lett May (1991), pp. 2693 2696, "An interferometer for atoms".

Primary Examiner—Robert Kunemund
Assistant Examiner—Ramamohan Rao Paladugu
Attorney, Agent, or Firm—Lowe, Price, LeBlanc & Becker

[57] ABSTRACT

A method of depositing atoms on a substrate in which a beam of atoms is optically focused utilizing a laser beam. The laser beam is used to form a standing wave above the surface of a substrate. As the beam of atoms is passed through the standing wave, the atoms are focused by dipole force interactions. The deposition of atoms is focused into parallel lines which coincide with the minima of the standing wave. The use of two standing waves allows for focusing the atoms into discrete dots or spots. Relative movement between the substrate and the standing wave(s) allows for depositing atoms in a scanning manner. Various nanostructures can be made by the disclosed method.

46 Claims, 1 Drawing Sheet

METHOD OF FABRICATING LASER CONTROLLED NANOLITHOGRAPHY

TECHNICAL FIELD

The present invention relates to the field of lithography. More particularly, the present invention relates to laser controlled nanolithography, application thereof, and devices produced thereby.

BACKGROUND ART

Recent developments in the field of atomic physics have made it possible to control the motion of atoms in a vacuum using laser beams. Research to date has mainly been directed toward slowing a beam of atoms and creating a local energy minimum that could be used to contain or "trap" atoms within an optical field. More recently emphasis has been placed on steering and focusing atom beams using laser generated optical fields. This technology has been referred to as "atom optics." Atom optics is analogous to either light optics with the glass lens elements being replaced by shaped optical fields which are produced by lasers, or electron optics with optical fields instead of static electric or magnetic fields.

A first step toward the practical realization of using atoms to produce microstructures directly was reported by Timp et al ("Using Light as a Lens for Submicron, Neutral-Atom Lithography", *Physical Review Letters*, Vol. 69, No. 11, Sep. 14, 1992, pp. 1636–1639). In this method, an optical standing wave is positioned between a source of atoms and the surface upon which the atoms are to be deposited. Alternating rows of intense and weak radiation of the standing wave field cause atoms to be deflected to form lines of atoms on the surface. The lines are spaced by the periodicity of the peaks in the radiation field, i.e., a distance of one-half of the wavelength of the light.

The disclosure of Timp et al is limited to the use of a sodium atom beam and thus sodium deposition. However, sodium structures which can be made from such techniques are of little practical value due to the extreme reactivity of sodiums.

DISCLOSURE OF THE INVENTION

It is accordingly one object of the present invention to provide a method of focusing an atomic beam using light.

Another object of the present invention is to provide a method of depositing materials on substrates in patterns having nanometer dimensions.

It is a further object of the present invention to provide a method focusing and depositing chromium atoms on a substrate.

A further object of the present invention is to provide a method of forming three-dimensional nanometer structures.

A still further object of the present invention is to provide a method of controlling the deposition of atoms on surfaces.

According to these and further objects of the present invention which will become apparent as the description thereof proceeds, the present invention provides a method of depositing atoms on a substrate which involves:

providing a substrate having a surface;
forming a beam of atoms;
collimating and optically pumping the beam of atoms to form a collimated beam of atoms;
providing at least one standing wave above the surface of the substrate for optically focusing the collimated beam of atoms; and
directing the collimated beam of atoms through the at least one standing wave and onto the surface of the substrate.

The present invention also provides a process of molecular beam epitaxy in which a flow of atoms directed toward a surface for deposition thereon is optically focused and scanned over the surface.

BRIEF DESCRIPTION OF THE DRAWINGS

The invention will be described with reference to the attached drawings which are given by way of non-limiting examples only, in which.

BEST MODE FOR CARRYING OUT THE INVENTION

Figure 1:
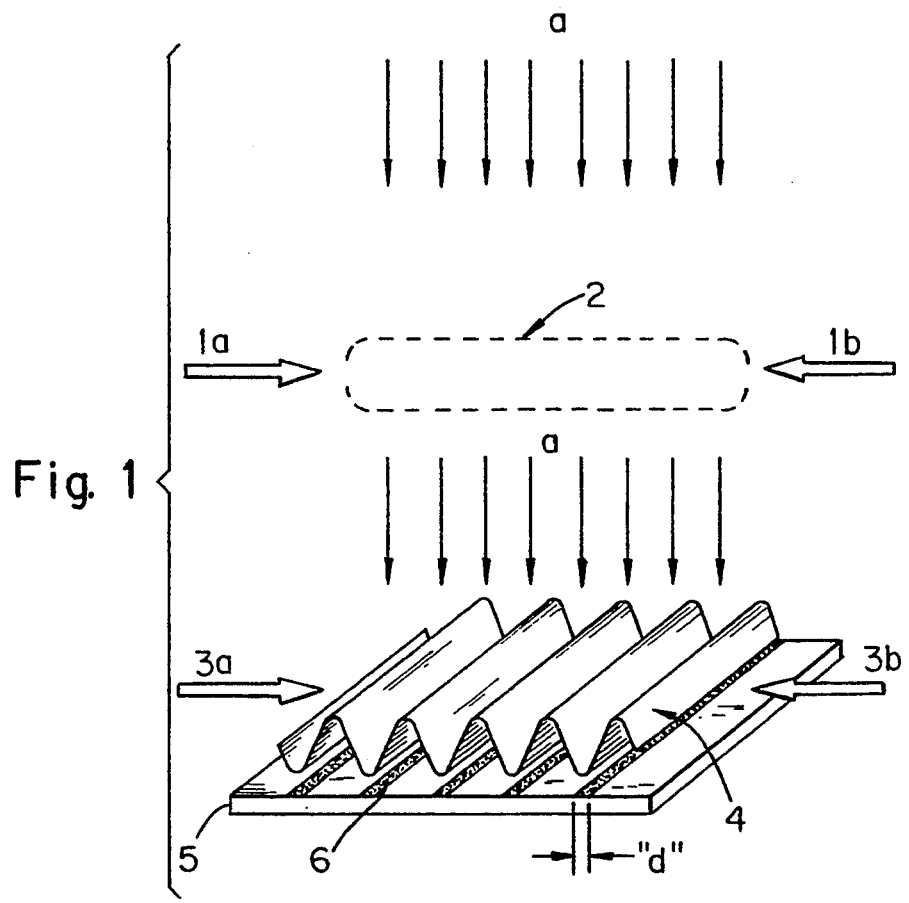
FIG. 1 is a schematic representation of the deposition process according to one embodiment of the present invention.

The present invention is directed to a method for nanolithography which uses the force exerted by light to deflect a neutral atomic beam during deposition onto a surface. For a stationary, two-level atom the average stimulated force exerted by nearly resonant light is proportional to the intensity gradient. In a standing wave, the intensity oscillates spatially every half wavelength, and the corresponding oscillations in the average force on an atom can be used as an array of cylindrical lenses. If the frequency of the standing wave is detuned above the two-level resonance, the atoms are attracted toward the intensity nodes. Similarly, if the frequency of the standing wave is detuned below the two-level resonance, the atoms are attracted toward the intensity antinodes.

Two forces are most responsible for the deflection of atoms by incident light. The most readily understood is the recoil force which arises because an atom absorbing light will recoil in the direction of the light while it recoils in an arbitrary direction after emitting the absorbed light. Thus, on the average, a net transfer of momentum has occurred in the direction of the propagation of the light.

Slightly more abstract is the interaction of an induced electric dipole moment on the irradiated atom with a rapidly oscillating optical radiation field. The force derived from this interaction can cause the atoms to be either attached or repelled from areas of high optical field strength depending on the relative wavelengths of the laser light and the absorption wavelength of the atom being irradiated.

Hence, optical fields, most usefully generated by lasers, can be used to cause element specific deflection of atomic beams. By carefully controlling the shape of the laser field, the equivalent of lens elements can be created and the atom beams can be focused. When focused to a high degree, such atoms can be utilized according to the present invention to create nanoscale structures on surfaces.

Previous attempts to focus atoms using a standing wave have produced deposition lines which are not exceptionally narrow. Two possible steering effects are believed to contribute to this problem. First, for high intensities, channeling takes place. Essentially, the incident atoms are multiply reflected from the regions of high intensity and come to rest at a position between the radiation peaks, or in the channels. However, because of multiple scattering, the resulting lines many have widths of up to 100 nm. For lower radiation intensities, focusing can occur and the incident atom beam can ideally be focused by the field to form lines as narrow as 5 nm. In order to obtain these results the incident atom beams must be very collimated. This can be done by confinement or, as in the case of the present invention, by using optical pumping and trapping techniques to greatly reduce the transverse velocity components of the beam.

Generally, the present invention involves the optical control of a chromium atom beam. This is based upon studies of the energy level scheme of the chromium atom and applicants' novel method of providing proper interaction between laser beam(s) and the chromium atoms.

In the present invention applicants utilize a one-dimensional optical molasses to effect collimation of an atomic Cr beam. The atomic Cr beam is illuminated by a single-frequency ring laser which is tuned slightly below the $^7S_3$ to $^7P_4$ atomic transition at 425.43 nm. Counter-propagating laser beams incident perpendicular to the atom beam result in a region of optical molasses which collimates the beam to better than 0.2 mrad. The collimated Cr beam is further manipulated using dipole force interactions in another laser beam which forms a standing wave above the surface of a substrate. The dipole force focuses the atoms into narrow lines, effecting controlled deposition of chromium structures on the substrate.

According to the present invention, the atomic Cr beam is subjected to a one-dimensional optical molasses which are provided in the first steps in a scheme to use the forces exerted by light on atoms to control deposition on a surface. As discussed below, this leads to new ways to fabricate microscopic structures with higher resolution and parallelism than can be obtained with conventional techniques.

As opposed to previous techniques which involve the use of sodium atoms, the use of chromium atoms in the present invention provides a number of significant advantages. For example, as noted above, chromium is less chemical reactive than sodium. In addition, chromium displays a low surface mobility and is UHV compatible. The use of chromium also has been found to enable simpler laser beam arrangements due to that fact that no hyperfine structure is involved.

The single-frequency light from a commercial UV-pumped stabilized ring dye laser with stilbene 420 dye was used to excite the $^7S_3$ to $^7P_4$ transition in Cr at 425.43 nm. The most abundant isotope of chromium, $^{52}Cr$ (84%), has no hyperfine structure. Hence repeated laser interaction can be carried out on the J=3 to J'=4 fine structure transition using a single laser frequency without the type of pumping loss mechanisms found in alkali systems.

The Cr atomic beam is produced with a high temperature oven containing an electron-beam heated Ta cell filled with 80 g of Cr crystals. The operating temperature ranges from 1200° to 1500° C. At these temperatures, Cr sublimates inside the cell and vapor diffuses through a 1 mm circular aperture. Atomic fluxes as high as $6 \times 10^{19}$ atoms.m$^{-2}$.s$^{-1}$ have been obtained at a distance of 200 mm from the oven aperture.

Using two counter-propagating laser beams, a region of one-dimensional optical molasses has been generated. The laser beams are tuned below the resonance frequency of the atomic transition, and are incident perpendicular to the atomic beam. The transverse velocity spread of the atomic beam has been interrogated by measuring the beam profile at a position downstream from the molasses region. The atoms are illuminated with a probe beam tuned to the resonance frequency, and the fluorescence is imaged with a CCD camera. Transverse temperature near of below the Doppler limit has been observed with perpendicular linear polarizations in the two molasses beams (lin $\perp$ lin configuration). The imaged profile is a convolution of the residual transverse spread and the fundamental atomic beam profile.

In lithography techniques, the molasses-collimated Cr atomic beam needs only to be subjected to light force interactions to effect controlled deposition of structures on a surface.

FIG. 1 is a schematic representation of the deposition process according to one embodiment of the present invention. As seen in FIG. 1 opposing laser beams 1a and 1b, which can be produced by reflecting a single laser beam back on itself, produce an optical molasses 2 which collimates the atoms, shown by arrows "a", which are produced in a high temperature oven as discussed above. In addition, laser beams 3a and 3b produce a standing wave 4 above substrate 5. Atoms, shown by arrows "a", from an atomic beam are directed first through the optical molasses 2 and then through the standing wave 4 prior to reaching substrate 5. The molasses 2 collimates the atomic beam. As a result of the focusing effect of the standing wave 4 the atoms are deposited on the surface of the substrate 5 in parallel lines 6. The linear pattern of the deposited atoms corresponds to the minima of the standing wave 4 due to the fact that the atoms are optically focused toward the minima of the standing wave.

During the course of the present invention, it has been determined that the chromium can be deposited in a linear pattern as depicted in FIG. 1 with a width "d" of about 5 nm.

Figure 2:
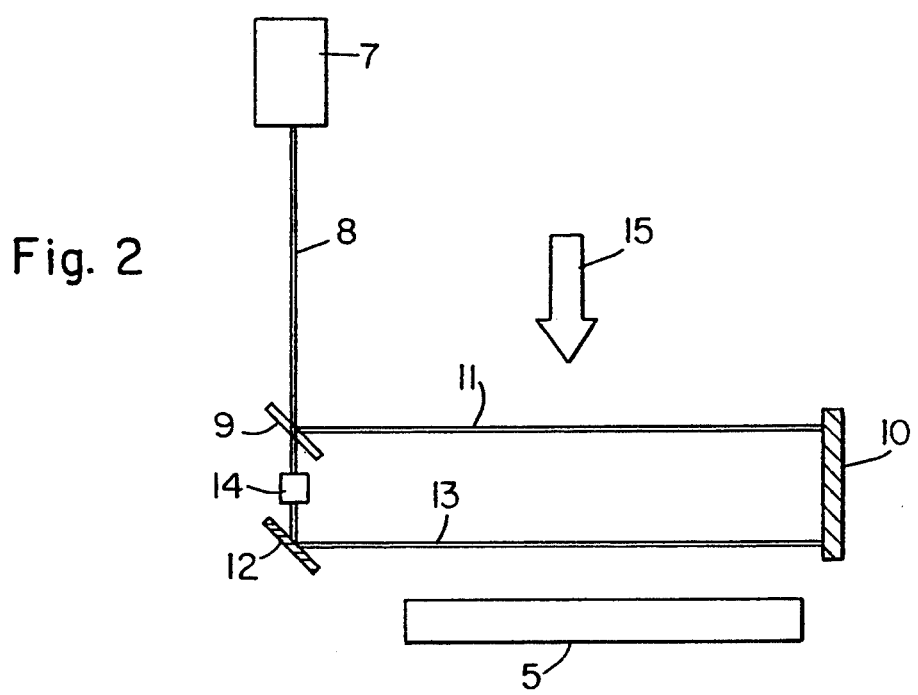
FIG. 2 is a schematic diagram of an optical apparatus according to one embodiment of the present invention.

FIG. 2 is a schematic diagram of an optical apparatus according to one embodiment of the present invention. As depicted in FIG. 2 a single-frequency laser 7 produces a beam of light 8 which is used both to generate an optical molasses 11 and a standing wave 13 above the substrate surface. The light beam 8 has a wavelength of 425.43 nm and frequency which is slightly (approximately 5 MHz) below the resonant frequency of the atomic transition of chromium. The light beam 8 is partially reflected off a beam splitter 9 and retroreflected by mirror 10 to form an optical molasses 11 above the surface of the substrate 5.

The portion of the light beam which passes through the beam splitter 9 is reflected off mirror 12 and retroreflected by mirror 10 to form a standing wave 13 between the surface of the substrate 5 and optical molasses 11. As shown in FIG. 2 an acoustic-optic modulator (AO) 14 is provided between beam splitter 9 and mirror 12 for controlling the frequency of the beam which produces the standing wave 13. In a preferred embodiment a variable 200 MHz AO was utilized to shift the frequency of the beam approximately 200 MHz so as to be above the resonant frequency of the atomic transition of chromium. In FIG. 2 arrow 15 represents the beam of atoms.

According to the present invention two standing wave radiation fields, preferably orthogonal, can be used to create a plurality of minima aligned in an array pattern which would focus the atoms so that the resulting deposition would form an array of dots on the surface of the substrate. The two orthogonal standing wave radiation fields are superposed in a con, non plane so that atoms in the collimated atomic beam are focused into discrete dots or spots.

It is also possible according to the present invention to translate the standing wave(s) in order to produce an array of structures. In this regard, it is only necessary to provide relative motion between the substrate and the radiation field(s) by moving one relative to the other or by moving both in different directions. According to one embodiment of the present invention, the desired movement can be achieved by mounting either or both the substrate and/or the optical apparatus which generates the radiation field(s) on separate stages which are movable by means of a controlled piezoelectric crystal.

In instances wherein it is desired to produce only one or a few lines of deposited material, a filter can be positioned between the incident atomic flux and the laser radiation pattern. The filter can be a nanofabricated mesh made from a metal such as tungsten with apertures equal to half the wavelength which is spaced in multiples of the wavelength. For a single line of deposited material, the filter can include a single elongated aperture. In the above embodiment which utilizes two orthogonal standing waves, the filter can have any number of apertures to form a desired pattern of dots or a single dot of deposited material.

As discussed above, applicants' used of chromium has numerous advantages over sodium. According to another embodiment of the present invention applicants have determined that chromium can be used as a primer layer for other materials such as gold, platinum and other precious metals. Thus, a layer or pattern of chromium atoms can deposited on a substrate and thereafter a complementarily layer or pattern, or partial layer or pattern, of another material or materials can be deposited on the deposited chromium atoms. This technique can be particularly advantageous when a desired material demonstrates better adhesion to chromium than the substrate material.

In further accordance with the present invention, a pattern of chromium can be deposited on a substrate layer and used as an optical mask for processing semiconductor devices according to conventional photolithographic techniques. The use of a chromium mask produced by the method of the present invention would enable a dramatic reduction in the size of patterns presently produced by masking methods.

In addition to being applicable as optical masks in photolithographic techniques, a similar pattern of chromium can be used as a mask in plasma etching techniques. According to this embodiment, a pattern of chromium is first deposited on a semiconductor substrate. Thereafter, the semiconductor substrate is subjected to a plasma etching process. During the plasma etching process the portion or areas of the semiconductor substrate which is (are) not covered by the chromium is eroded as a result of the plasma etching. This technique enables the fabrication of nanostructures and facilitates the fabrication of various semiconductor devices and devices which are presently made by micromachining methods.

In addition to depositing chromium as a layer or pattern on the surface of a substrate, it is also possible to merely deposit or implant a doping quantity of chromium on a semiconductor device. The present invention has particular utility in this field since the optical generation of a pattern can be used to selectively dope an area or areas of a semiconductor device.

The techniques of the present invention can also be combined with molecular beam epitaxy (MBE). In MBE a constant flow of atoms is caused to impinge on a surface with the desired result that the atoms will grow epitaxially so as to from a crystal lattice which is identical and coherent with the substrate lattice. A wide variety of new materials with novel properties have been produced in this manner. In the process of MBE, it is important to carefully balance the flux rate of the incoming particles and the temperature of the substrate. If the flux rate is too high a newly arrived particle may become attached to another recently arrived particle, and become immobilized, before it has time to diffuse along the surface and find its correct position in the crystal lattice. Raising the substrate temperature increases the mobility of the atoms already on the surface and thereby improves the growth by facilitating the diffusion of atoms to their correct positions prior to the arrival of addition atoms. However, in many cases, raising the temperature of the substrate also increases the bulk diffusion coefficient, which controls the diffusion of atoms into the bulk of the material, thereby causing a deterioration of the structure. By using atom optical control of the incident atom beam, the deposition can produce lines of atoms which can be scanned across the surface by either moving the substrate or the radiation field(s). This would be analogous to painting a surface with a paint roller as compared with a sprayer; only the unpainted (non-deposited) surface of the substrate would receive the new paint (particles).

Because the present invention allows incident atoms to be focused in an array of points (utilizing two orthogonal standing waves), it is possible to grow high profile structures perpendicular to the substrate surface. This allows the production of structures such as interconnections between layers of semiconductor devices. Alternatively, an array of needles, i.e., field emitter tips, could be grown. Such an array would be very useful in highly parallel extensions of such scanned probe instruments as scanning tunneling microscopes, scanning atomic force microscopes, and the like. Many of these probes have been shown to be effective in probing and modifying surfaces but are limited in that, to date, they have not been adapted for mass production because they only act at one point. The optically controlled deposition technique of the present invention can be used to fabricate large arrays of such custom tailored tips. Additionally, similar tips can be used in field emission arrays for specialized electron sources. The optically controlled deposition techniques of the present invention can be used to fabricate these structures as well.

Because the optical radiation field used in the present invention only effects the atom that it is near resonance with, it is possible to use other particles to monitor the growth of the surface structures. For example, the growth of a structure could take place in a scanning electron microscope (SEM) with the optical field positioned just above the sample. While growth is underway, the structure being fabricated could be observed using conventional SEM, backscattering, Auger, or other electron based microscopes. In contrast to the present invention, conventional methods of growing structures are generally invasive and do not permit imaging the structure during deposition. The present invention allows observation of growth which it is taking place and thus, provides for an exceptional level of control and detailed study the growth process.

In addition to being able to produce a vast variety of complex structures and devices, the method of the present invention can produce some simple, but very important devices. For example, a simple linear pattern of deposited material such as chromium has a accuracy which is based upon the laser wavelength. Thus, such a structure is ideal for use as a calibration standard for electron microscopes and other devices which measure sizes on the scale of micrometers and nanometers.

Optical gratings can easily be fabricated according to the present invention with precise control of the shape of the periodic structure deposited on the substrate surface. This can be accomplished by programming the scanning of the substrate under an optical field that produces lines of atoms. Tailoring the shape of the grating surface allows for greater operational efficiency and characteristics.

Since the focusing of the optical field depends on a near resonance of the light's wavelength with an absorption feature in the atom being focused, it is possible to evaporate more that one species at a time and to have only the species in resonance with an applied laser field be focused during deposition. Therefore, patterns can be produced in one or more elements while others are uniformly applied. One use of this technique can be to form magnetic dots composed of $CrO_2$. This can be accomplished by the co-deposition of chromium and oxygen, with the laser field arranged to focus the chromium into a desired pattern such as an array of dots or spots. Alternatively, the chromium pattern could be deposited and later oxidized. Such an array could serve as the media for a high density magnetic storage system. Other magnetic materials such as ferro magnetic materials, ferri magnetic materials, and antiferro magnetic materials could also be deposited according to the present invention.

As a generalization of the growth of magnetic $CrO_2$ dots, a similar technique could be used to deposit strips or $CrO_2$. One of the major problems in magnetic recording is the noise that arises at the edges of a recorded band. By creating the magnetic media in strips, of a width less than that of the recording head, edge noise could be eliminated.

While the present invention, as described above involves the use of an optical field to focus atoms for deposition on a surface, the same optical field can be applied to atomic microscopy in a reverse manner. Specifically, an optical field such as that produced by the present invention can be used to focus into a detector only those atoms originating from a specific spot on a surface. Such a probe would have the advantages of high elemental specificity and a resolution in the nanometer range.

Although the present invention has been described with reference to particular means, materials and embodiments, from the foregoing description, one skilled in the art can easily ascertain the essential characteristics of the present invention and various changes and modifications may be made to adapt the various uses and characteristics without departing from the spirit and scope of the present invention as described by the claims which follow.

What is claimed is:

1. In a process of molecular beam epitaxy wherein a flow of atoms is directed toward a surface for deposition thereon, the improvement which comprises, optically focusing and scanning said flow of atoms over said surface.

2. A method of depositing atoms on a substrate which comprises:
   providing a substrate having a surface;
   forming a beam of chromium atoms;
   collimating said beam of chromium atoms to form a collimated beam of atoms;
   providing at least one laser beam above said surface of said substrate for optically focusing said collimated beam of chromium atoms; and
   directing said collimated beam of chromium atoms through said at least one laser beam and onto said surface of said substrate.

3. A method of depositing atoms on a substrate according to claim 2, wherein each of said at least one laser beams comprise a standing wave.

4. A method of depositing atoms on a substrate according to claim 3, wherein said at least one laser beam comprises two standing waves.

5. A method of depositing atoms on a substrate according to claim 4, wherein said two standing waves are orthogonal to each other.

6. A method of depositing atoms on a substrate according to claim 2, wherein said beam of chromium atoms is both collimated and laser cooled prior to being directed through said at least one laser beam and onto said surface of said substrate.

7. A method of depositing atoms on a substrate according to claim 2, wherein said chromium atoms are deposited onto said surface of said substrate to form a primer layer which is subsequently covered with an additional layer.

8. A method of depositing atoms on a substrate according to claim 2, wherein said chromium atoms are deposited onto said surface of said substrate in a pattern which is used as a mask in a subsequent process step.

9. A method of depositing atoms on a substrate according to claim 8, wherein said subsequent process step comprises etching portions of said substrate which are not covered by said chromium atoms.

10. A method of depositing atoms on a substrate according to claim 9, wherein said etching comprises plasma etching.

11. A method of depositing atoms on a substrate according to claim 2, wherein said chromium atoms provide a doped region on said substrate.

12. A method of depositing atoms on a substrate according to claim 2, wherein said substrate is moved with respect to said at least one laser beam during the deposition.

13. A method of depositing atoms on a substrate according to claim 2, wherein said at least one laser beam is moved with respect to said substrate during the deposition.

14. A method of depositing atoms on a substrate according to claim 2, wherein at least one filter having at least one aperture is provided between said collimated beam of atoms and said at least one laser beam.

15. A method of depositing atoms on a substrate according to claim 14, wherein said at least one aperture comprises a plurality of apertures.

16. A method of depositing atoms on a substrate according to claim 13, wherein at least one filter having at least one aperture is provided between said collimated beam of atoms and said at least one standing wave and said at least one filter is moved together with said at least one laser beam.

17. A method of depositing atoms on a substrate according to claim 16, wherein said at least one aperture comprises a plurality of apertures.

18. A method of depositing atoms on a substrate according to claim 17, wherein said at least one filter comprises two filters.

19. A method of depositing atoms on a substrate according to claim 2, wherein said deposited atoms comprise a chromium oxide magnetic material.

20. A method of depositing atoms on a substrate according to claim 19, wherein said chromium oxide magnetic material is deposited in a pattern.

21. A method of depositing atoms on a substrate according to claim 20, wherein said pattern comprises a series of dots.

22. A method of depositing atoms on a substrate according to claim 20, wherein said pattern comprises a strip.

23. A method of depositing atoms on a substrate according to claim 19, wherein said chromium oxide magnetic material is formed by co-depositing chromium atoms and oxygen atoms.

24. A method of depositing atoms on a substrate according to claim 19, wherein said chromium oxide magnetic material is formed by depositing chromium atoms and thereafter oxidizing said deposited chromium atoms.

25. A method of depositing atoms on a substrate according to claim 2, wherein an additional atomic or molecular species is added together with said chromium atoms.

26. A method of depositing atoms on a substrate according to claim 25, wherein said additional atomic or molecular species is not optically focused by said at least one standing wave.

27. A method of depositing atoms on a substrate according to claim 2, wherein said deposition of atoms is observed during the deposition utilizing a scanning electron microscope.

28. A method of depositing atoms on a substrate which comprises:
providing a substrate having a surface;
forming a beam of atoms;
collimating said beam of atoms to form a collimated beam of atoms;
providing at least one standing wave above said surface of said substrate for optically focusing said collimated beam of atoms; and
directing said collimated beam of atoms through said at least one standing wave and onto said surface of said substrate so as to form a mask pattern on said surface of said substrate which is used in a subsequent process step.

29. A method of depositing atoms on a substrate according to claim 28, wherein said subsequent process step comprises etching portions of said substrate which are not covered by said mask pattern.

30. A method of depositing atoms on a substrate according to claim 29, wherein said etching comprises plasma etching.

31. A method of depositing atoms on a substrate which comprises:
providing a substrate having a surface;
forming a beam of atoms;
collimating said beam of atoms to form a collimated beam of atoms;
providing at least one standing wave above said surface of said substrate for optically focusing said collimated beam of atoms; and
directing said collimated beam of atoms through said at least one standing wave and onto said surface of said substrate to form a doped region on said substrate.

32. A method of depositing atoms on a substrate which comprises:
providing a substrate having a surface;
forming a beam of atoms;
collimating said beam of atoms to form a collimated beam of atoms;
providing at least one standing wave above said surface of said substrate for optically focusing said collimated beam of atoms;
directing said collimated beam of atoms through said at least one standing wave and onto said surface of said substrate; and
moving one of said substrate or said at least one standing wave with respect to the other.

33. A method of depositing atoms on a substrate which comprises:
providing a substrate having a surface;
forming a beam of atoms;
collimating said beam of atoms to form a collimated beam of atoms;
providing at least one standing wave above said surface of said substrate for optically focusing said collimated beam of atoms;
providing at least one filter having at least one aperture between said collimated beams of atoms and said at least one standing wave; and
directing said collimated beam of atoms through said at least one filter and said at least one standing wave and onto said surface of said substrate.

34. A method of depositing atoms on a substrate according to claim 33, wherein said at least one aperture comprises a plurality of apertures.

35. A method of depositing atoms on a substrate according to claim 33, wherein said at least one filter comprises two filters.

36. A method of depositing atoms on a substrate which comprises:
providing a substrate having a surface;
forming a beam of atoms;
collimating said beam of atoms to form a collimated beam of atoms;
providing at least one standing wave above said surface of said substrate for optically focusing said collimated beam of atoms; and
directing said collimated beam of atoms through said at least one standing wave and onto said surface of said substrate, whereby said atoms are deposited as a magnetic material on said substrate.

37. A method of depositing atoms on a substrate according to claim 36, wherein said magnetic material is deposited in an array of dots on said substrate.

38. A method of depositing atoms on a substrate according to claim 36, wherein said magnetic material is deposited in a strip on said substrate.

39. A method of depositing atoms on a substrate according to claim 36, wherein said magnetic material is selected from the group consisting of ferro magnetic materials, ferri magnetic materials, and antiferro magnetic materials.

40. A method of forming a calibration standard which comprises:
   providing a substrate having a surface;
   forming a beam of atoms;
   collimating said beam of atoms to form a collimated beam of atoms;
   providing at least one standing wave above said surface of said substrate for optically focusing said collimated beam of atoms; and
   directing said collimated beam of atoms through said at least one standing wave and onto said surface of said substrate so as to deposit said atoms in an absolute pattern for use as a microscopic calibration standard 41. A method of forming an optical grating which comprises:
   providing a substrate having a surface;
   forming a beam of atoms;
   collimating said beam of atoms to form a collimated beam of atoms;
   providing at least one standing wave above said surface of said substrate for optically focusing said collimated beam of atoms; and
   directing said collimated beam of atoms through said at least one standing wave and onto said surface of said substrate so as to form an optical grating structure.

42. A method of forming an optical grating according to claim 41, wherein said substrate is moved with respect to said at least one standing wave during the formation of said optical grating structure.

43. A method of forming an optical grating according to claim 41, wherein said at least standing wave is moved with respect to said substrate during the formation of said optical grating structure.

44. A method of forming probe structures on a substrate which comprises:
   providing a substrate having a surface;
   forming beam of atoms;
   collimating said beam of atoms to form a collimated beam of atoms;
   providing at least one standing wave above said surface of said substrate for optically focusing said collimated beam of atoms; and
   directing said collimated beam of atoms through said at least one standing wave and onto said surface of said substrate and thereby form probe structures which extend from said surface of said substrate.

45. In a method of surface analysis wherein atomic or molecular species from a surface are received by a detector the improvement comprising providing at least one laser beam which directs said atomic or molecular species to said detector.

46. A method of surface analysis according to claim 45, wherein said detector comprises a microscope.

* * * * *